United States Patent [19]

Heberle

[11] Patent Number: 4,935,619

[45] Date of Patent: Jun. 19, 1990

[54] WIRELESS REMOTE-CONTROL SYSTEM FOR ELECTRONIC APPARATUS

[75] Inventor: Klaus Heberle, Reute, Fed. Rep. of Germany

[73] Assignee: Deutsche ITT Industries GmbH, Freiburg, Fed. Rep. of Germany

[21] Appl. No.: 338,255

[22] Filed: Apr. 14, 1989

[30] Foreign Application Priority Data

Apr. 29, 1988 [EP] European Pat. Off. ........ 88106983.5
Dec. 21, 1988 [EP] European Pat. Off. ........ 88121384.7

[51] Int. Cl.$^5$ .................. G01V 9/04; G06M 7/00; H01J 40/14
[52] U.S. Cl. ................................. 250/221; 340/710
[58] Field of Search ............ 250/221, 237 G, 237 R; 340/712, 710, 709; 455/603, 605; 358/105, 194.1

[56] References Cited

U.S. PATENT DOCUMENTS 2,948,890  4/1960  Barth et al. .
3,996,463 12/1976  Jablonowski ........................ 39/12
4,550,250 10/1985  Mueller et al. ................. 250/203 R
4,578,674  3/1986  Baker et al. ....................... 340/710
4,688,933  8/1987  Lapeyre .............................. 356/1
4,745,402  5/1988  Auerbach .......................... 340/709

FOREIGN PATENT DOCUMENTS 0206246  6/1986  European Pat. Off. .
1203597  8/1970  United Kingdom .

Primary Examiner—David C. Nelms
Assistant Examiner—George C. Beck
Attorney, Agent, or Firm—Thomas L. Peterson

[57] ABSTRACT

Wireless remote-control system with motion-dependent controls for electronic apparatus and, in particular, for entertainment-electronics apparatus, has a remote-control transmitter, a remote-control receiver contained in the electronic apparatus, at least one radiation source contained in the remote-control transmitter or the electronic apparatus, at least two radiation detectors contained in the electronic apparatus or the remote-control transmitter, and means associated with the radiation detectors for deriving electric signals from the motion of the remote-control transmitter and the remote-control receiver or the electronic apparatus relative to each other.

7 Claims, 5 Drawing Sheets

WIRELESS REMOTE-CONTROL SYSTEM FOR ELECTRONIC APPARATUS

BACKGROUND OF THE INVENTION

The present invention pertains to the field of wireless remote-control systems for electronic apparatus and, in particular, to wireless remote-control systems for entertainment-electronics apparatus.

A conventional remote-control transmitter in a wireless remote-control system for electronic apparatus and, in particular, for entertainment-electronics apparatus, generates control signals for controlling the electronic apparatus when a user depresses keys. The control signals typically comprise a suitably modulated ultrasound or infrared signal.

In view of the large number of control commands which are possible and necessary for use with electronic apparatus today, there is a problem in fabricating wireless remote control systems which have an increasingly large number of keys for use at the remote-control transmitter. As a result of this, there is a need in the art to decrease the number of such keys without, at the same time, reducing the number of possible control commands.

SUMMARY OF THE INVENTION

Embodiments of the present invention solve the above-stated problem. In particular, in one embodiment of a first aspect of the present invention, signals which contain information pertaining to the direction and speed of motion of a remote-control transmitter can be derived from the motion of the remote-control transmitter relative to a fixed radiation source which is mounted, for example, on the apparatus to be controlled. Further, remote-control signals are generated by using the direct-motion signals and a suitably programmed microprocessor, such as is contained in present-day remote-control transmitters and electronic apparatus.

BRIEF DESCRIPTION OF THE FIGURES

A complete understanding of the present invention may be gained by considering the following detailed description in conjunction with the accompanying drawing, in which:

FIG. 2b shows a graphical representation of the waveforms of output signals from the light collectors shown in FIG. 2a;

To facilitate understanding, identical reference numerals have been used to denote identical elements common to the figures.

DETAILED DESCRIPTION

Figure 1:
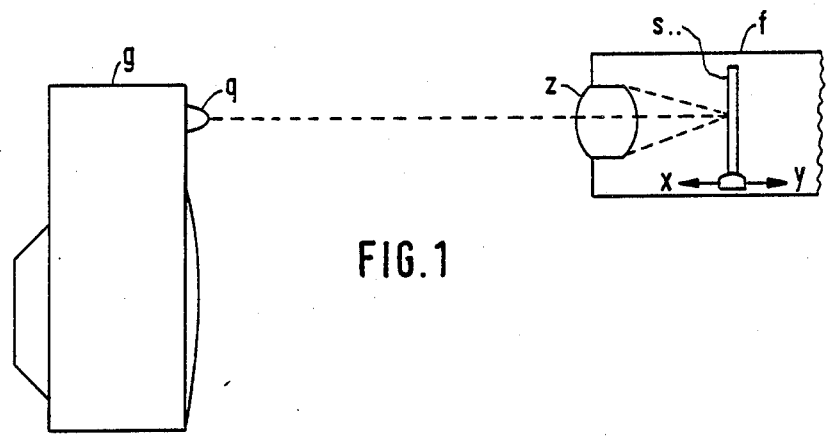
FIG. 1 shows, in pictorial form, an embodiment of a first aspect of the present invention.

FIG. 1 shows, in pictorial form, an embodiment of a first aspect of the present invention. As shown in FIG. 1, radiation source q, preferably a point source of infrared radiation, is disposed at electronic apparatus g, illustrated as a television set.

Further, FIG. 1 shows the portion of remote-control transmitter f which contains an electrooptical input stage. This is the only portion of remote-control transmitter f shown because the other parts of remote-control transmitter f are of conventional design and, as such, are well known to those of ordinary skill in the art. For example, remote-control transmitter f also contains a radiation source (not shown) which is fed by remote-control signals and with which at least one corresponding radiation receiver (not shown) is associated in electronic apparatus g.

As shown in FIG. 1, radiation emitted by radiation source q is projected by means of cylindrical lens z onto light collectors s . . . . The surfaces of light collectors s . . . , which surfaces are illuminated by the radiation emitted by radiation source q, preferably lie in the focal plane of cylindrical lens z. As a result, as shown in FIG. 2a, radiation source q, which is preferably a point source, is imaged onto light collectors s . . . as a line st.

Figure 2A:
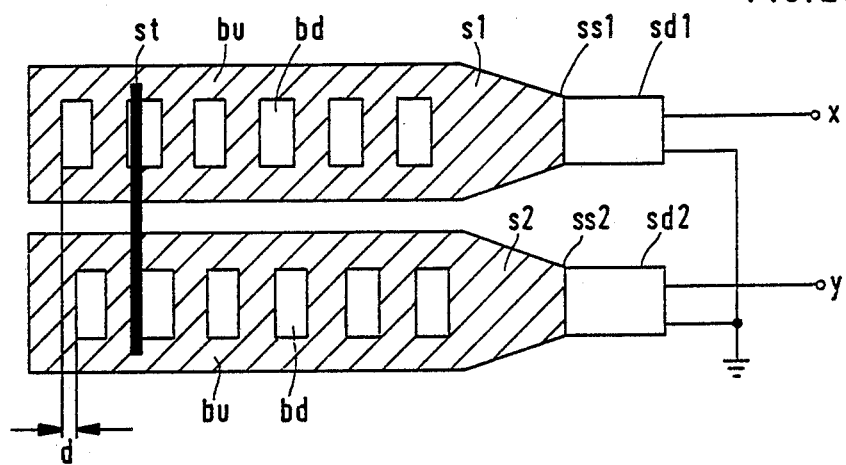
FIG. 2a shows, in pictorial form, light collectors used in the first embodiment of the present invention.

FIG. 2a shows, in pictorial form, the design of light collectors s1 and s2 and their relative position. Their longitudinal axes are parallel to each other and the illuminated surface of each collector is provided with a regular pattern of alternately transparent and opaque areas bd and bu, respectively. The pattern of light collector s1 is laterally displaced relative to that of light collector s2 by the distance d, which distance d is preferably equal to one-half the width of transparent areas bd. Radiation detectors sd1 and sd2 are located at radiation collection points ss1 and ss2, respectively, of the two light collectors s1 and s2, respectively, and the outputs from radiation detectors sd1 and sd2 provide signals x and y, respectively. Further, as shown in FIG. 2a, one terminal of each of the two radiation detectors sd1 and sd2 can be connected to ground.

Figure 2B:
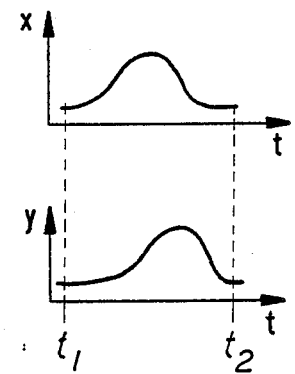

FIG. 2b is a graphical representation which shows the variation of output signals x and y with time as line st moves over the transparent and opaque areas bd and bu when remote-control transmitter f moves. It is important to note that the maxima in the respective curves x and y are shifted in time with respect to each other.

Figure 3:
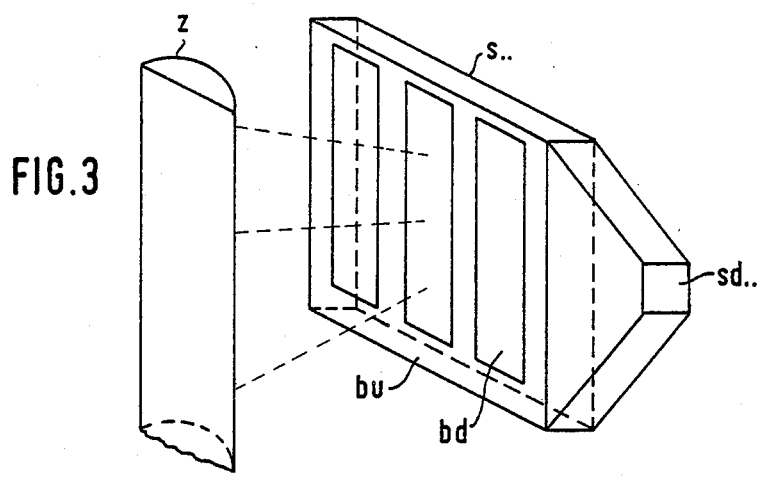
FIG. 3 shows, in pictorial form, a perspective view of one of the light collectors shown in FIG. 2 and of the relative position of the cylindrical lens of FIG. 1 with respect thereto.

FIG. 3 shows, in pictorial form, a perspective view of one of the light collectors s . . . and of the relative position of cylindrical lens z with respect thereto. Light collectors s . . . are made of a material, preferably a suitable plastic, which directs the radiation entering at the side, through the transparent areas bd, to the radiation collection point sd . . . by total reflection at the other interfaces. This advantageously eliminates the need to provide a large number of individual radiation detectors.

Figure 4:
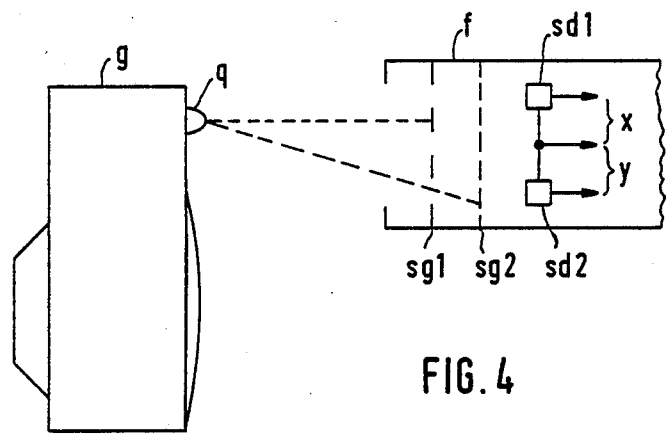
FIG. 4 shows, in pictorial form, another embodiment of the first aspect of the present invention.

FIG. 4 shows, in pictorial form, a second embodiment of the first aspect of the present invention. As shown in FIG. 4, the electrooptical system of remote-control transmitter f contains an optical input in the form of a first optical stripe grating sg1 and a second optical stripe grating sg2, which second optical stripe grating sg2 is positioned in the beam path behind, and in parallel spaced relation to, first optical stripe grating sg1. Further, second optical stripe grating sg2 has a grating constant which is equal to or less than that of first optical stripe grating sg1.

Figure 5:
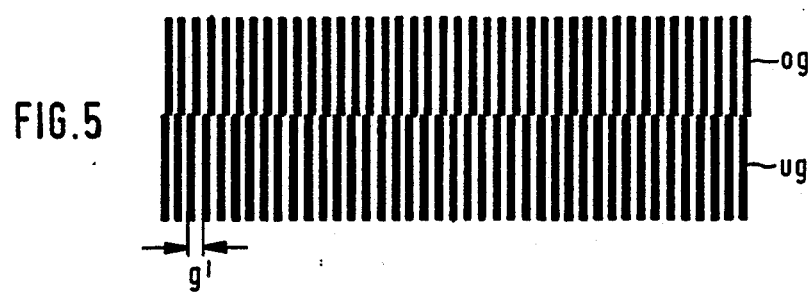
FIG. 5 shows, in pictorial form, the relationship between two subgratings of the second stripe optical grating of the embodiment shown in FIG. 4.

As shown in FIG. 5, second optical stripe grating sg2 comprises an upper subgrating og and a lower subgrating ug. The stripes are of lower subgrating ug are displaced by one-quarter of the grating constant g' with respect to the stripes of upper subgrating og.

As shown in FIG. 4, radiation detectors sd1 and sd2 are disposed behind upper subgrating og and lower subgrating ug, respectively, and radiation detectors sd1 and sd2 provide signals x and y, respectively.

The second embodiment of the first aspect of the present invention makes use of a kind of "Louver effect." Specifically, as remote-control transmitter f moves, the shadow of first stripe grating sg1 moves over second stripe grating sg2. The resulting optical interferences are converted into electric signals x and y by the two radiation detectors sd1 and sd2, respectively. The distance between stripe gratings sg1 and sg2 is determined by the angular separation which is just resolvable and by the grating constant of second stripe grating sg2, in light of the criterion that the manual motion control should not become too sensitive or too insensitive. The waveforms of signals x and y for this embodiment correspond qualitatively to those of the signals of FIG. 2b, i.e., the maxima are again shifted in time with respect to each other.

Figure 6:
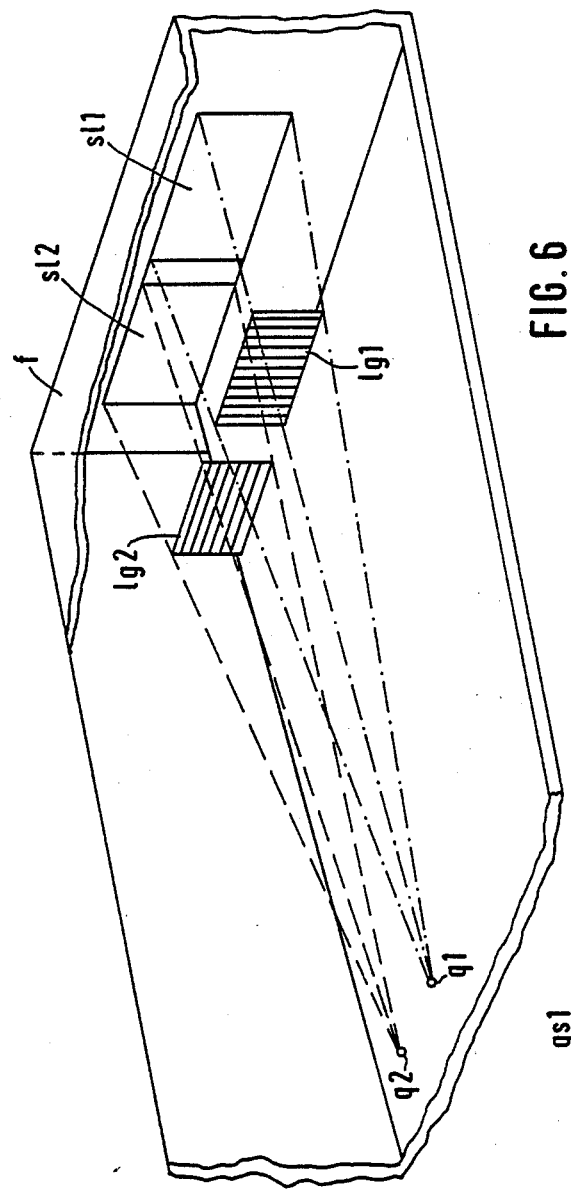
FIG. 6 shows, in pictorial form, a sectional perspective view of a remote-control transmitter which illustrates the relative positions of electrooptical components in the remote-control transmitter and the manner in which a second aspect of the present invention operates.

FIG. 6 shows, in pictorial form, a sectional perspective view of remote-control transmitter f which illustrates the relative positions of electrooptical components lg1 and lg2 therewithin and the manner in which a second aspect of the present invention operates As such, FIG. 6 only shows those parts of remote-control transmitter f which form part of the electrooptical output stage thereof.

Inside remote-control transmitter f, ruled gratings lg1 and lg2 are disposed in front of beam openings s11 and s12, respectively. Ruled gratings lg1 and lg2 are irradiated by radiation sources q1 and q2, respectively. This is indicated in FIG. 6 by the beams which pass through the four corners of each of the ruled gratings lg1 and lg2 and the beam openings s11 and s12, the beams also serving as projecting lines. Radiation sources q1 and q2 are preferably infrared sources.

Ruled grating lg1 has vertical equidistant lines, while ruled grating lg2 has horizontal equidistant lines, ruled gratings lg1 and lg2 being disposed so that the two sets of lines are disposed at 90 degrees to each other. Radiation sources q1 and q2 are shielded from each other by a partition (not shown) to ensure that the radiation from radiation source q1, for example, can only reach associated ruled grating lg1. The partition extends lengthwise through the electronic output stage and up to the bridge between the two openings s11 and s12.

The portion of remote-control transmitter f which is not shown contains the usual subcircuits of such a unit, as was stated above in connection with FIG. 1. As is well known to those of ordinary skill in the art, these are essentially the subcircuits for generating individual remote-control signals and for driving the two radiation sources q1 and q2.

Figure 7:
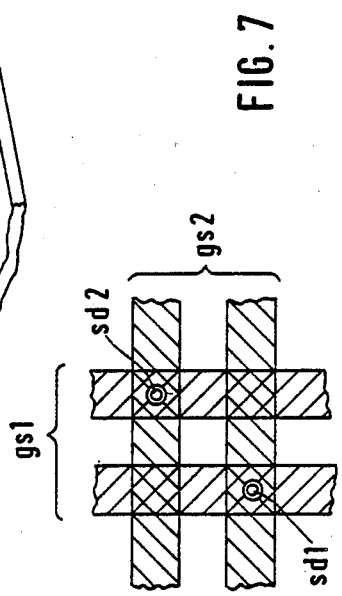
FIG. 7 shows, in pictorial form, the spatial arrangement of radiation detectors disposed at the electronic apparatus in the second aspect of the present invention.

FIG. 7 shows, in pictorial form, how radiation detectors sd1 are sd2 are arranged at electronic apparatus g. Specifically, radiation detectors sd1 and sd2 are arranged so that the line joining them makes angles of 45 with respect to the directions of vertical and horizontal shadows gs1 and gs2 of ruled gratings lg1 and lg2, respectively. This arrangement advantageously permits motion detection in the vertical and horizontal directions with only two radiation detectors.

Figure 8:
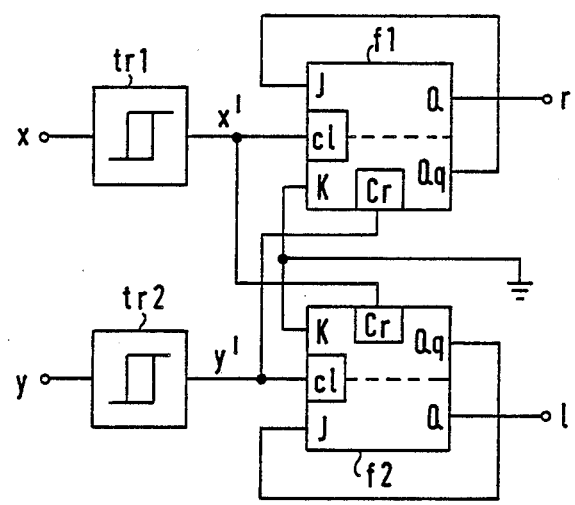
FIG. 8 shows a simple circuit for deriving a direction signal from the two output signals of the embodiments of FIGS. 2, 4, or 7.

FIG. 8 shows a simple circuit comprised of two Schmitt triggers tr1 and tr2 and two JK flip-flops f1 and f2 for use in generating electric signals r and l in response to output signals x and y provided by the electrooptical input stage of FIGS. 1 to 4. Electric signals r and l contain, inter alia, the information on the direction of motion of remote-control transmitter f.

Figures 9A, 9B:
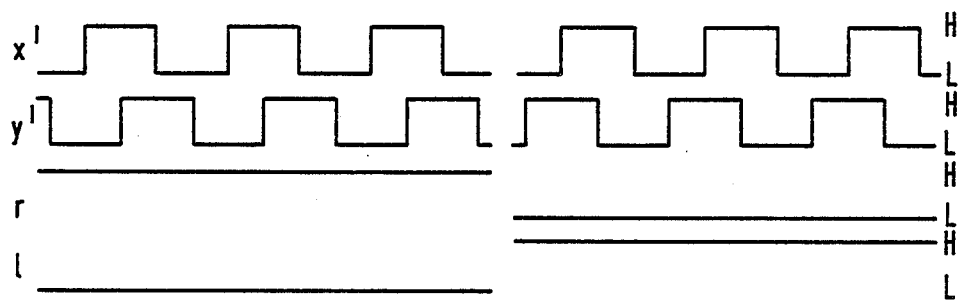
FIGS. 9a and 9b are graphical representations of the waveforms of the input and output signals of the simple circuit shown in FIG. 8.

Square-wave output signals x' and y' shown in FIGS. 9a and 9b correspond to the ideal time sequence of the light-dark pattern moving over the respective radiation detectors sd1 and sd2, which is one of the projected ruled gratings lg1 and lg2. In FIG. 8, the outputs from Schmitt triggers tr1 and tr2 are fed to the clock inputs cl of JK flip-flops f1 and f2, respectively. The clear input Cr of JK flip-flop f2 is connected to the output of Schmitt trigger tr1 and the clear input Cr of JK flip-flop f1 is connected to the output of Schmitt trigger tr2. The K inputs of JK flip-flops f1 are f2 are grounded and each of the flip-flops has its J input connected to its Qq output. The Q output of flip-flop f2 provides signal r, which signal r indicates a right-hand motion, and the Q output of flip-flop f2 provides signal 1, which signal 1 indicates a left-hand motion. Schmitt triggers tr1 and tr2 change output signals x and y, which output signals x and y are approximately sin- or sin²-shaped as shown in FIG. 2b, into square-wave signals x' and y' shown in FIGS. 9a and 9b.

The simple evaluating circuit of FIG. 8 only provides information as to whether a right-hand motion or a left-hand motion is being made. To determine the associated speed, the instantaneous frequencies of square-wave signals x' and y' can be evaluated, cf. FIG. 9. The extent of advance can be determined from the number of pulses of x' or y' which are accumulated from a given point of time.

FIG. 9a shows the waveforms of signals x', y', r, and l during a right-hand motion, during which right-hand motion the x'-signals lead the y'-signals, while FIG. 9b shows the case for a left-hand motion, during which left-hand motion the x'-signals lag the y'-signals. In FIG. 9a, the r-signal is at the H level, and the l-signal at the L level. In FIG. 9b, the l-signal is at the H level, and the r-signal at the L level (the H level is the more positive one of the two levels, H and L, which can be assumed by the respective Q output).

As stated above, the four signals shown in FIGS. 9a and 9b contain both information on the direction of motion of remote-control transmitter f and information on how far and how fast remote-control transmitter f is being moved. It is thus readily possible for the skilled practitioner to control the above-mentioned microprocessor in the remote-control transmitter or the electronic apparatus with these signals and to derive corresponding remote-control signals for electronic apparatus g therefrom. By means of the information on the distance by which the remote-control transmitter f has been moved, an analog or continuous control signal, e.g., a volume, brightness, or contrast control signal, can be generated. It is also possible to implement menu-control systems as are commonly used with computers and the well-known, so-called mouse. According to the invention, therefore, the remote-control transmitter can be designed as an "electronic mouse".

It may be advantageous to incorporate into the remote-control transmitter a second electrooptical system which is of the same design as the electrooptical system of the first aspect of the present invention which is shown in FIGS. 1 to 5, which second electrooptical system is perpendicular to the first system to provide additional vertical motion direction.

If in embodiments of the first aspect of the present invention the radiation emitted by radiation source q is modulated, a bidirectional data link can be established with the remote-control transmitter.

In the embodiment of the second aspect of the present invention which is shown in FIGS. 6 and 7, detection of horizontal and vertical motion is much simpler, because a single, diagonally oriented pair of radiation detectors can separate the directions of motion. Then, however, an identification code is necessary which makes it possible to determine whether horizontal ruled grating lg2 or vertical ruled grating lg1 is being projected. Suitable code elements are, for example, different pulse lengths, pulse intervals, pulse trains or synchronizing signals, such as multiple pulses, and the like.

The two radiation sources q1 and q2 are preferably energized in a time-division multiplex mode with short drive pulses and at a clock frequency which is high compared to the low-frequency information contents of the two detector signals, so that it can be easily filtered out.

Preferably, the two radiation sources q1 are q2 are clocked in such a manner that the interval between the energization of radiation source q1 and that of radiation source q2 is shorter (or longer) than the interval between the energization of radiation source q2 and that of radiation source q1. If the sequence of energizations is q1, q2, q1, q2 . . . , the sequence of intervals between energizations will be, for example, 1 us, 2 us, 1 us . . . The clocking is thus the alternate energization of the radiation sources q1 and q2 and the intervals of different length are the code.

Figure 10:
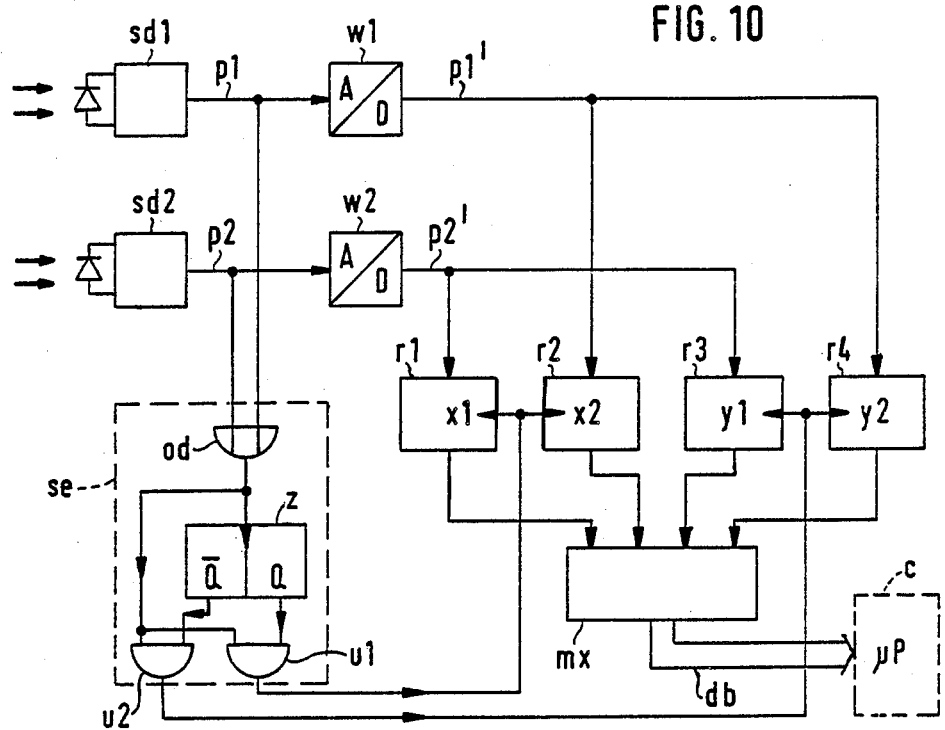
FIG. 10 is a block diagram of a circuit arrangement for separating clocked horizontal and vertical detector output signals in embodiments of the present invention.

FIG. 10 is a block diagram of a circuit arrangement for separating the vertical and horizontal signal components of the two diagonally arranged radiation detectors sd1 and sd2. This circuit arrangement has an added advantage in that it does not use a fixed threshold value, as is the case, for example, in the formation of the two square-wave signals x' and y' by means of trigger circuits tr1 and tr2 as shown in FIG. 8. With the fixed threshold value, the distance-dependent output signals of radiation detectors sd1 and sd2, which vary widely in amplitude, can be optimally sensed only within a small amplitude range. At large amplitudes due to a short distance, the threshold is too low, and in the reverse case, i.e., at small amplitudes due to a long distance, the threshold is too high. This is remedied by digitizing detector output signals p1 and p2 by means of the two analog-to-digital converters w1 and w2 and feeding the digital signals p1' and p2' into an all-digital evaluation device, such as the schematically depicted microprocessor c.

The digital processing permits a comparison between the relative amplitudes of digital signals p1' and p2' or forms a tracking threshold value from the amplitude values of the digital signals. Filter circuits implemented in software, for example, may be used to suppress interfering signals.

In the separating circuit shown in FIG. 10, the output of first radiation detector sd1, namely, detector output signal p1, is applied to the input of first analog-to-digital converter w1 and to one input of OR gate od. The output of second radiation detector sd2 is fed to second analog-to-digital converter w2 and to the other input of OR gate od.

OR gate od forms part of controller se, which controller se decides whether detector output signals p1 and p2 are to be assigned to horizontal ruled grating lg2 or to vertical ruled grating lg1. Since the drive pulse for second radiation source q2 occurs shortly after the drive pulse for first radiation source q1, see FIG. 11, an unambiguous assignment can be determined by triggering a time window zt on the trailing edges of detector output signals p1 and p2. This time window covers the drive duration t2 for second radiation source q2. When triggered by second radiation source q2, however, time window zt' lies within drive interval pv. By simple logical operations, received detector output signals p1 and p2 can thus be assigned to either horizontal ruled grating lg2 or vertical ruled grating lg1. An example of such an assignment circuit is shown in controller se, in which controller se the output of OR gate od is applied to the clock input of timer z, to one input of a first AND gate u1, and to one input of a second AND gate u2. The other inputs of the two AND gates are connected, respectively, to the Q and Q outputs of timer z, which is, for example, a one-shot multivibrator. If, for example, horizontal ruled grating lg2 is assigned to the duration t1, first AND gate u1 will produce the associated drive pulse. Correspondingly, in the duration t2, the associated drive pulse is provided by the second AND gate. The outputs of each of these two gates enable two buffers r1, . . . . r4 to accept the two digital signals p1' and p2'. By means of multiplexer mx, the four stored values y1, y2, x1, and x2 are placed on a common data bus db, which is coupled, for example, to the data input of microprocessor c, in which the actual amplitude evaluation takes place.

Figure 11:
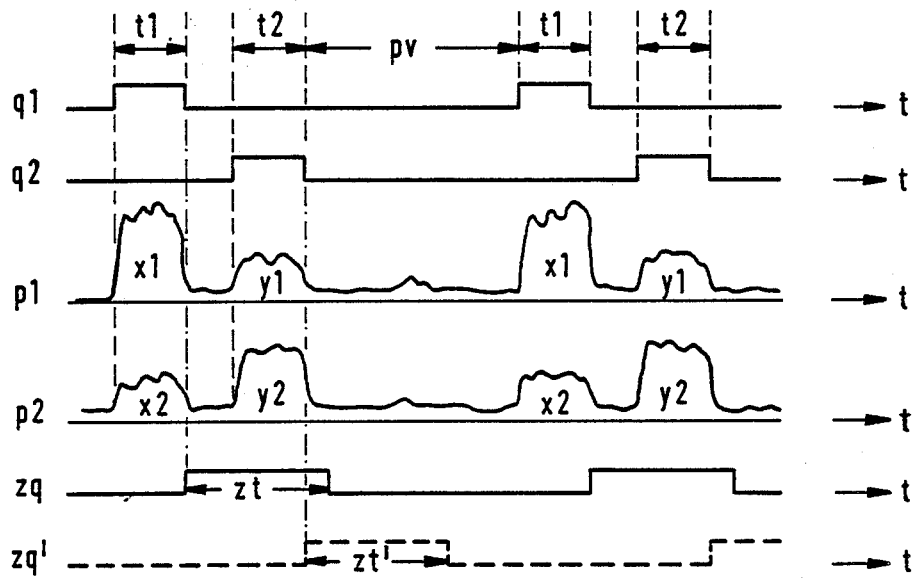
FIG. 11 shows graphical representations of the waveforms of several signals for the circuit arrangement shown in FIG. 10.

FIG. 11 shows graphical representations of the waveforms of several signals of the circuit arrangement of FIG. 10. The first two graphs illustrate the energization of the two radiation sources q1 and q2, with horizontal ruled grating lg2 being illuminated during time duration t1 and vertical ruled grating lg1 being illuminated during time duration t2. The third and fourth graphs show output signals p1 and p2 of first and second radiation detectors sd1 and sd2, respectively, it being assumed, like in the real case, that the horizontal and vertical detector signals y1, y2, x1, and x2 have different pulse heights and are superposed with interfering signals.

The next to the last graph of FIG. 11 shows the Q output signal zq of timer z with time window zt, which is triggered by detector output signals p1 and p2 at the end of time period t1. The Q output signal zq' of timer z, shown by a dashed line, contains time window zt', which is triggered at the end of second time period t2. In this case, too, the illustrated logical interconnection of AND gates u1 and u2 and timer z ensures a correct assignment of the horizontal and vertical detector signals y1, y2, x1, and x2. In FIG. 10 it is assumed that the logic devices shown are activated by low levels, so that negative logic is used.

What is claimed is:

1. A wireless remote-control system for electronic apparatus and, in particular, for entertainment electronics apparatus, comprising:
   a remote-control transmitter of the type including a transmitter unit for transmitting control signals for controlling the electronic apparatus;
   a remote-control receiver which is contained in the electronic apparatus for receiving the transmitted control signals and controlling the electronic apparatus in accordance therewith;
   at least one radiation source for emitting a beam of radiation which is contained in one of said remote-control transmitter and said electronic apparatus;
   at least two radiation detectors which are contained in the other one of said remote-control transmitter and said electronic apparatus for detecting the emitted beam of radiation from said radiation source; and
   means, responsive to outputs from said at least two radiation detectors, for generating electric signals indicative of motion of said remote-control transmitter relative to said electronic apparatus.
   wherein the remote-control transmitter comprises an electrooptical input stage having an electrooptical system comprised of:
   a cylindrical lens as an optical input for the emitted radiation beam to the remote-control transmitter; and
   two light collectors arranged optically behind the cylindrical lens and side by side, each of the two light collectors having a collector surface which is swept by the radiation emerging from the cylindrical lens and which collector surface is provided with a regular pattern of alternately transparent and opaque areas, wherein one pattern of one of the two light collectors is displaced relative to the other; and
   respective radiation detectors located at a radiation collector point of each of the two light collectors.

2. A wireless remote-control system for electronic apparatus and, in particular, for entertainment electronics apparatus, comprising:
   a remote-control transmitter of the type including a transmitter unit for transmitting control signals for controlling the electronic apparatus;
   a remote-control receiver which is contained in the electronic apparatus for receiving the transmitted control signals and controlling the electronic apparatus in accordance therewith;
   at least one radiation source for emitting a beam of radiation which is contained in one of said remote-control transmitter and said electronic apparatus;
   at least two radiation detectors which are contained in the other one of said remote-control transmitter and said electronic apparatus for detecting the emitted beam of radiation from said radiation source; and
   means, responsive to outputs from said at least two radiation detectors, for generating electric signals indicative of motion of said remote-control transmitter relative to said electronic apparatus,
   wherein the remote-control transmitter comprises an electrooptical input stage having an electrooptical system comprised of:
   a first optical stripe grating as an optical input for the emitted radiation beam and a second optical stripe grating positioned in the beam path behind, in spaced relation from, and parallel to the first optical stripe grating and having the same or a smaller grating constant;
   the second optical stripe grating comprised of an upper subgrating with stripes and a lower subgrating with stripes, the stripes of the lower subgrating being displaced by one-quarter the grating constant relative to the stripes of the upper subgrating; and
   the upper and lower subgratings being connected to a first radiation detector and a second radiation detector, respectively.

3. The wireless remote-control system for electronic apparatus of claim 1 wherein the electrooptical input stage further comprises a second said electrooptical system wherein the second said electrooptical system is rotated with respect to the first system in a plane parallel to the plane of the first system by 90 degrees.

4. The wireless remote-control system for electronic apparatus of claim 3 wherein the electrooptical input stage further comprises a second said electrooptical system wherein the second said electrooptical system is rotated with respect to the first system in a plane parallel to the plane of the first system by 90 degrees.

5. A wireless remote-control system for electronic apparatus and, in particular, for entertainment electronics apparatus, comprising:
   a remote-control transmitter of the type including a transmitter unit for transmitting control signals for controlling the electronic apparatus;
   a remote-control receiver which is contained in the electronic apparatus for receiving the transmitted control signals and controlling the electronic apparatus in accordance therewith;
   at least one radiation source for emitting a beam of radiation which is contained in one of said remote-control transmitter and said electronic apparatus;
   at least two radiation detectors which are contained in the other one of said remote-control transmitter and said electronic apparatus for detecting the emitted beam of radiation from said radiation source; and
   means, responsive to outputs from said at least two radiation detectors, for generating electric signals indicative of motion of said remote-control transmitter relative to said electronic apparatus,
   wherein the remote-control transmitter comprises:
   a first radiation source and a first ruled grating;
   a second radiation source and a second ruled grating which is oriented perpendicular to the first ruled grating, the first and second radiation sources and first and second ruled gratings forming an electrooptical output stage of the remote-control transmitter;
   two radiation detectors disposed in the electronic apparatus whose connecting line makes angles of substantially 45 degrees with the projected images of the lines of the two ruled gratings;

means for alternately energizing the two radiation sources; and means for modulating a code signal onto respective drive signals for each of the two radiation sources.

6. A wireless remote-control system for electronic apparatus and, in particular, for entertainment electronics apparatus, comprising:

a remote-control transmitter of the type including a transmitter unit for transmitting remote-control signals for controlling the electronic apparatus;

a remote-control receiver which is contained in the electronic apparatus for receiving the transmitted control signals and controlling the electronic apparatus in accordance therewith;

at least one radiation source for emitting a beam of radiation which is contained in one of said remote-control transmitter and said electronic apparatus;

at least two radiation detectors which are contained in the other one of said remote-control transmitter and said electronic apparatus for detecting the emitted beam of radiation from said radiation source; and motion indicating means, responsive to outputs from said at least two radiation detectors, for generating electric signals indicative of the motion of said remote-control transmitter relative to said electronic apparatus, wherein said motion indicating means comprises said two radiation detectors being offset from each other by a predetermined spacing and having means for providing respective detection output signals at respective positions in time based upon detection of the emitted radiation beam from said at least one radiation source, and determining means for determining the speed or distance and direction of relative motion between the remote-control transmitter and the electronic apparatus based upon the predetermined offset spacing of the two radiation detectors and the difference in time positions of the detection output signals generated in response to detection of the emitted radiation beam, whereby the determined speed and direction of relative motion can be converted into corresponding remote-control signals for transmission by said remote-control transmitter to said electronic apparatus for remote-control thereof based on the relative motion.

7. The wireless remote-control system according to claim 6 further comprising a second radiation source or a second set of radiation detectors oriented perpendicular to said one radiation source or said first-mentioned set of radiation detectors, respectively, for indicating relative motion in first and second plane directions, correspondingly.

* * * * *